United States Patent [19]
Itoh

[11] Patent Number: 5,742,158
[45] Date of Patent: Apr. 21, 1998

[54] IC TEST HANDLER HAVING A PLANET ROTATING MECHANISM FOR COOLING OR HEATING ICS

[75] Inventor: Masato Itoh, Nagano, Japan

[73] Assignee: Sinano Electronics Co., Ltd., Nagano-ken, Japan

[21] Appl. No.: 675,299

[22] Filed: Jul. 1, 1996

[30] Foreign Application Priority Data

Dec. 22, 1995 [JP] Japan ................................. 7-335365

[51] Int. Cl.$^6$ .................................................. G01R 31/26
[52] U.S. Cl. ............................... 324/158.1; 324/765
[58] Field of Search .......................... 324/158.1, 765

[56] References Cited

U.S. PATENT DOCUMENTS

| | | | |
|---|---|---|---|
| 4,546,404 | 10/1985 | Cedrone et al. | 361/600 |
| 4,790,921 | 12/1988 | Bloomquist et al. | 204/192.12 |
| 5,310,039 | 5/1994 | Butera et al. | 198/346.2 |
| 5,445,064 | 8/1995 | Lopata | 99/421 H |
| 5,598,769 | 2/1997 | Luebke et al. | 99/395 |

FOREIGN PATENT DOCUMENTS 724770  7/1995  Japan .

Primary Examiner—Ernest F. Karlsen
Assistant Examiner—Russell M. Kobert
Attorney, Agent, or Firm—Sughrue, Mion, Zinn, Macpeak & Seas, PLLC

[57] ABSTRACT

An IC test handler having an IC constant temperature chamber 7 includes M plant IC holders 71 each having K surfaces, a planet holder arranging mechanism 72 and an intermittent rotation driving mechanism 73. The holders 71 are arranged in an annular array on the mechanism 72 and revolve around the shaft for the sun. The mechanism 73 intermittently rotates in a step of 360°/M so that when each holder 71 makes one rotation around the shaft for the sun, the number of rotations of each holder on its own shaft is $\{N\pm(1/K)\}$, where N is an integer. An IC which was attached to one of the K surfaces of a holder during one stop period in the intermittent rotation is removed from the holder during another stop period after the mechanism 73 has been rotated around the sun for a time sufficient for the IC to be preheated for the temperature test. Therefore, the number of preheated ICs in the IC constant temperature chamber can be increased, the test period can be shortened, the staying time for the preheating can be elongated and the space efficient in the chamber can be improved.

4 Claims, 8 Drawing Sheets

Fig. 8
PRIOR ART

IC TEST HANDLER HAVING A PLANET ROTATING MECHANISM FOR COOLING OR HEATING ICS

BACKGROUND OF THE INVENTION

(1) Field of the Invention

The present invention relates to an IC test handier equipped with a constant temperature chamber for cooling or heating ICs. More particularly, it relates to a rotating mechanism for IC holders in the constant temperature chamber.

(2) Description of the Related Art

In general, Semiconductor Integrated-Circuit Devices (hereinafter simply referred to as ICs), which have been manufactured, are subjected to a plurality of electric tests to determine their circuit reliability and electric characteristics.

Figure 6:
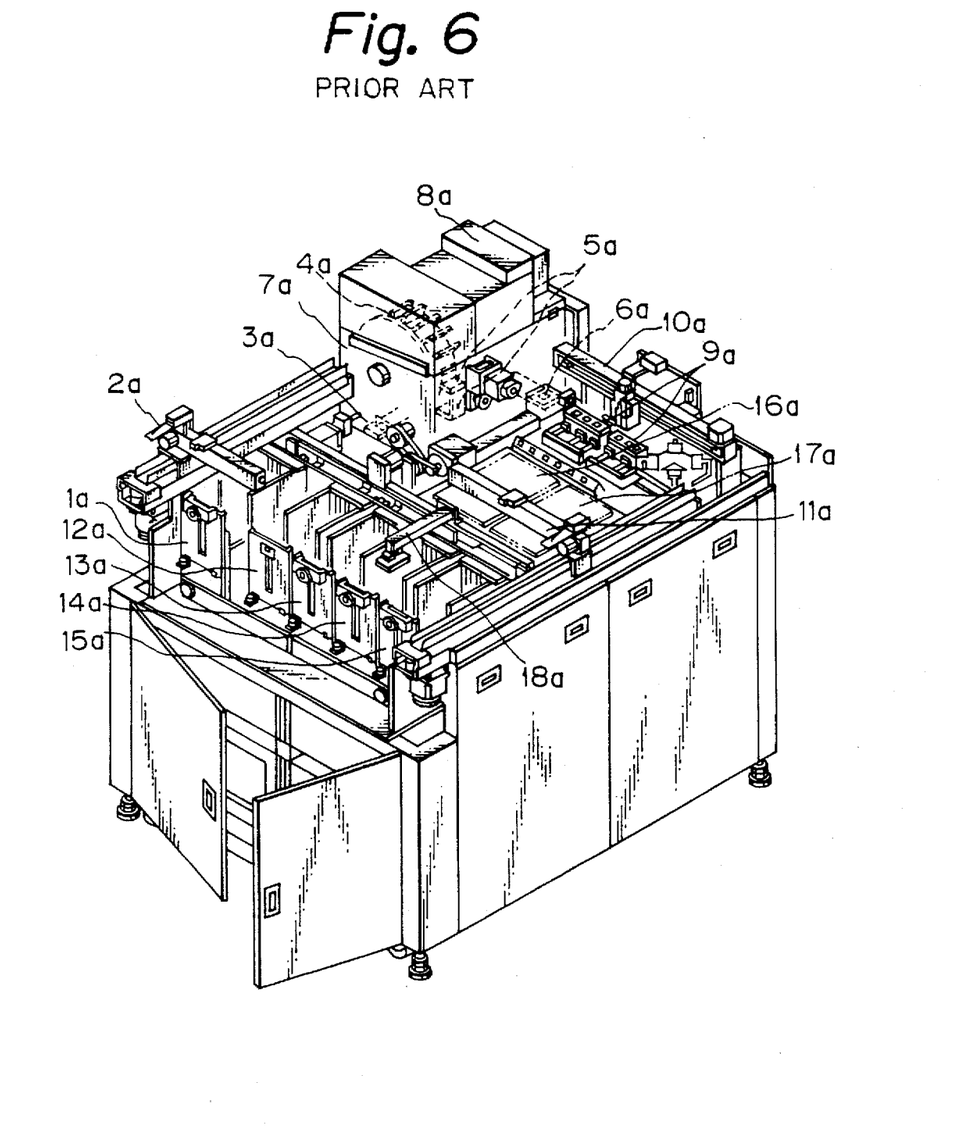
FIG. 6 is a perspective view showing an external view of a state in which a cover is removed from a prior-art IC test handler disclosed in the Japanese Patent Publication (Kokai) No. 7-24770 of the same applicant as the present application.

FIG. 6 is a perspective view showing an external view of a prior-art IC test handier in which, for the sake of easy understanding, a cover is removed therefrom, disclosed in Japanese laid-open Patent publication.(Kokai) No.7-24770 of an application pertaining to the same applicant as that of the present application. Referring to FIG. 6, many ICs to be tested are arranged and mounted on an input tray. When the input tray is lifted by an input tray elevator 1a and is stopped, the ICs in a two-dimensional arrangement on the input tray are picked up one by one and are moved to an entrance of a constant temperature chamber 7a by an input transfer unit 2a. Then, by an input shuttle 3a, each IC is supplied to be placed at an IC installing and removing position directly below a mechanism 4a in which IC holders are arranged in an annular array. Hereinafter, the mechanism 4a is referred to as an IC holder arranging mechanism. The IC holder arranging mechanism 4a is provided within the constant temperature chamber 7a. Each IC thus placed is retained in an empty IC holder. The constant temperature chamber 7a cools or heats the ICs for a predetermined period to perform temperature tests of the ICs. Hereinafter, the constant temperature chamber is referred to as an IC constant temperature chamber. In this connection, reference symbol 8a denotes a hot-wind blowing unit.

In the IC constant temperature chamber 7a, each of the ICs, which has been preheated and removed from the IC holder arranging mechanism 4a, is moved into a testing position by a contactor 5a, and then is lifted down to be fitted by pressure into an IC socket. After desired electric tests have been effected by an IC tester, the tested IC is detached from the IC socket and is moved to a carry out position. After this, the tested IC is moved to an outlet of the IC constant temperature chamber 7a by an output shuttle 6a, and is further moved from the outlet to an external waiting position of the IC constant temperature chamber 7a by a cooling shuttle 10a. Then, after the IC is moved by a cooling transfer unit 9a, it is classified and placed on an output tray 16a or 17a by an output transfer unit 11a. In this connection, reference symbols 12a and 13a denote empty tray elevators, reference symbols 14a and 15a denote output elevators, and a reference symbol 18a denotes a tray transfer unit.

Figure 7:
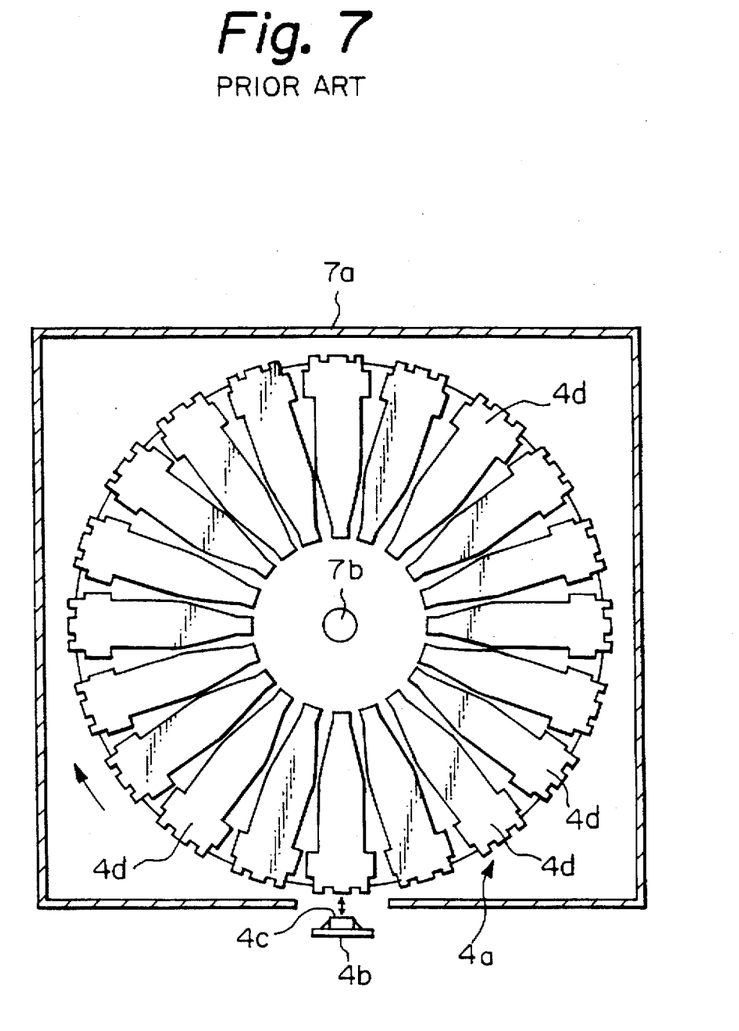
FIG. 7 is a vertical cross-sectional view showing an IC constant temperature chamber in the IC test handler shown in FIG. 6.

FIG. 7 is a cross-sectional view of the IC constant temperature chamber 7a in the prior-art IC test handler shown in FIG. 6. As shown in FIG. 7, the IC holder arranging mechanism 4a in the IC constant temperature chamber 7a includes a plurality of IC holders 4d which are annularly arranged at regular intervals around a horizontal rotating shaft 7b in the IC constant temperature chamber 7a and are supported relative to each other by frames. The IC holder arranging mechanism 4a can rotate within a vertical plane. An IC 4c placed on the IC installing or removing member 4b directly below the IC holder arranging mechanism 4a is adsorbed and sandwiched by an adsorbing and sandwiching mechanism in the IC holder 4d at the lowermost position facing to the IC 4c. During a hold time in which the IC holder arranging mechanism 4a makes one rotation, the IC 4c is heated at a constant temperature by heat conduction from a heat storing plate (IC receiving unit) of the IC holder.

Figure 8:
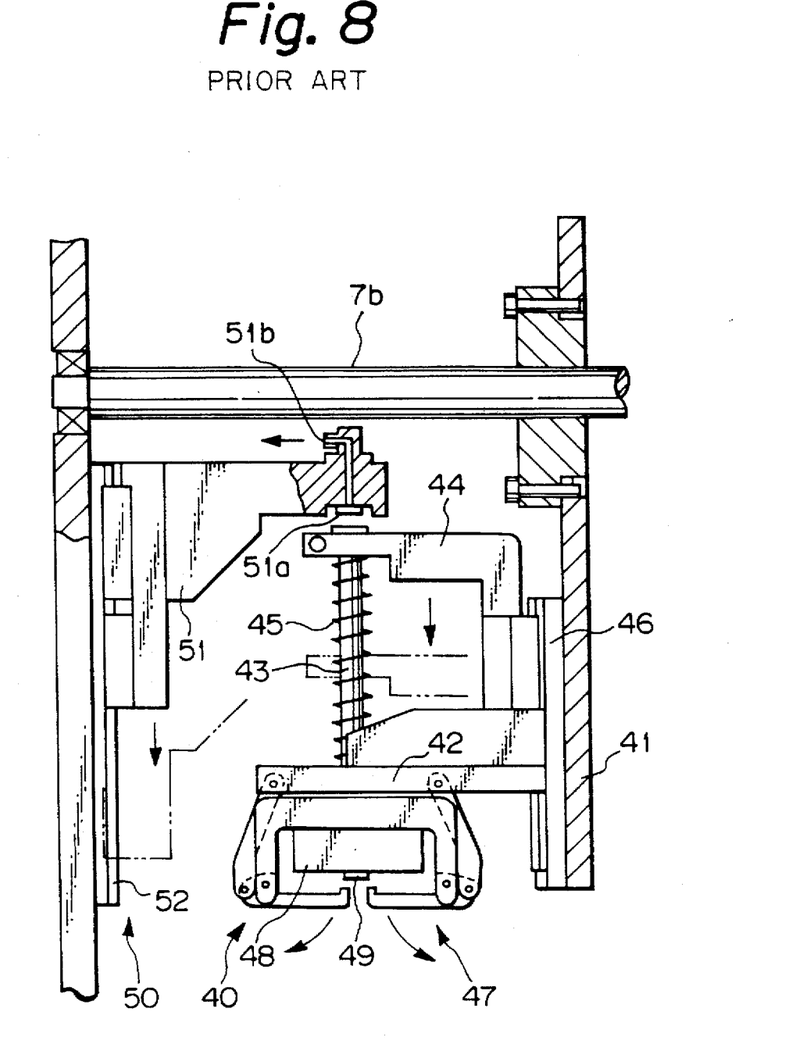
FIG. 8 is a partial side view showing an adsorbing and sandwiching means in the IC constant temperature chamber shown in FIG. 7.

FIG. 8 is a partial side view of the adsorbing and sandwiching mechanism in the IC constant temperature chamber 7a. As shown in FIG. 8, each of the IC holders 4d in the IC holder arranging mechanism 4a has the adsorbing and sandwiching mechanism 40 for effecting vacuum adsorption and mechanical sandwiching of an IC. This adsorbing and sandwiching mechanism 40 has a cantilever 42 fixed to a rotary side plate 41 of the IC holder arranging mechanism 4a, a sliding shaft 43 which is movable up and down through a vertical penetrating hole (not shown) of the cantilever 42, a holding arm 44 for holding the sliding shaft 43 at its upper end, a coil spring 45 for energizing the sliding shaft 43 to the upper direction, a slide guide rail 46 for guiding the movement of the sliding shaft 43, a chuck mechanism 47 for sandwiching or releasing the IC 4c along with the reciprocal up and down movement of the sliding shaft 43, and an adsorbing pad 49 communicated with an air adsorbing hole (not shown) opened to an IC receiving unit 48 and penetrating through the sliding shaft 43.

When an IC 4c is brought to the IC installing or removing member 4b directly below the IC holder arranging mechanism 4, a pressure applying member 51 of an adsorbing and sandwiching driving mechanism 50 is dropped along a slide guide rail 52, so that an elastic member 51a provided at the end of the pressure applying member 51 pushes the upper end surface of the sliding shaft 43 to drop the holding arm 44. Thereby, the chuck mechanism 47 is turned to an open state while it is dropping. On the other hand, when the sliding shaft 43 is dropped, an air adsorbing operation is effected through an air adsorbing hole 51b so that, when the adsorbing pad 49 touches the IC, the IC is adsorbed by the IC receiving unit 48. To the contrary, when the pressure applying member 51 moves up along the slide guide rail 52, the chuck mechanism 47 does not move upward so that it closes to sandwich the IC, and then, after the air adsorbing operation is stopped, the adsorption of the IC by the adsorbing pad 49 is stopped.

In the above-described prior-art IC test handler, however, there are the following problems.

(1) Once the IC holder arranging mechanism 4a has made one rotation, the IC which has been preheated can be removed from the IC receiving unit 48 and can be transferred to the testing position. If, however, a test cycle period for one IC by an IC tester, i.e., a period of each tact during which the contactor 5a is made one reciprocal movement, must be shortened because of the requirement of speed up of the IC test, the supply of the preheated IC to the contactor 5a will not be in time unless the tact period of the intermittent rotation of the IC holder arranging mechanism 4a is also shortened. If the speed of the intermittent rotation of the IC holder arranging mechanism 4 is raised, however, the period for preheating the IC (holding time) is disadvantageously shortened. Therefore, in principle, in the above-mentioned prior-art IC constant temperature chamber, it is impossible to elongate the preheating period by shortening the tact period.

Accordingly, to obtain a sufficient number of preheated ICs, the IC holder arranging mechanism 4a must have a large diameter to be able to have a larger number of IC holders 4d, so that the space occupied by the IC constant temperature chamber 7a in the IC test handler becomes large, leading a disadvantage in that the size of the temperature adjusting apparatus becomes too large to keep the heat capacity.

(2) Each IC holder 4d is provided with the adsorbing and sandwiching mechanism 40 which actively accesses the IC 4c placed on the IC installing/removing member 4b directly below the IC holder arranging mechanism 4a. In addition, the adsorbing and sandwiching mechanism 40 moves up and down the sliding shaft 43 to perform the vacuum adsorbing operation and the mechanical sandwiching operation. Therefore, the construction of the IC holder arranging mechanism 4a must have a large scale and must be complex. Further, the IC holder arranging mechanism 5 becomes heavy in weight which leads to an increase in driving load.

SUMMARY OF THE INVENTION

In view of the above-described problems, a first object of the present invention is to provide an IC test handler in which the number of preheated ICs can be increased, the shortening of the tact period and the elongation of the preheating period can be simultaneously attained, and the efficiency in space is improved.

A second object of the present invention is to provide an IC test handler which comprises an IC constant temperature chamber by which the adsorbing and sandwiching mechanism in the holding means of the IC holder can be simplified, and the number of parts and the driving load can be decreased.

To attain the above-mentioned first object, according to a first aspect of the present invention, there is provided a multi-rotation preheating system comprising a plurality of planet IC holders each having IC holding parts on a plurality of surfaces. That is, when K and M are natural numbers larger than or equal to 2, and N is an integer, an IC constant temperature chamber in an IC test handler according to the present invention comprises M planet IC holders. Each of the M planet IC holders is able to rotate on its own shaft for the planet, and has K surfaces of rotation symmetric with respect to the shaft for the planet. The K surfaces functions as IC holding parts. The IC constant temperature chamber also includes a planet holder arranging mechanism that can rotate around a shaft for a sun. On the planet holder arranging mechanism, the M planet IC holders are arranged in an annular array with equal intervals around the shaft for the sun. The M planet IC holders can revolve around the shaft for the sun. The IC constant temperature chamber further includes an intermittent rotation driving mechanism for intermittently rotating the planet holder arranging mechanism in a step of 360°/M so that, when each of the M planet IC holders revolves by 360° around the shaft for the sun, each of the M planet IC holder rotates on its own shaft for the planet by $$\{N\pm(1/K)\}*360°.$$

According to a second aspect of the present invention, each of the M planet IC holders comprises holding units each for holding an IC by making the IC attached to the K surfaces of rotation symmetric.

According to a third aspect of the present invention, each of the holding units comprises an air adsorbing passage having an IC adsorbing port opened to corresponding one of the K surfaces of rotation symmetric, and a spring-energized IC tension leaf for pressing a corresponding one of the ICs against the corresponding one of the K surfaces of rotation symmetric.

According to a fourth aspect of the present invention, at an IC installing or removing position directly below the planet holder arranging mechanism, there are provided a vacuum adsorbing unit for adsorbing the ICs by contacting with an exhaust port of the air adsorbing passage in the holding unit of the planet IC holder facing the IC installing or removing position, and an actuator for pressing and moving the spring-energized tension leaf to directly provide a driving force to the spring-energized tension leaf so as to drive the spring-energized tension leaf to release the IC from the spring-energized tension leaf.

As described above, according to the first aspect of the present invention, in the IC constant temperature chamber comprising the M planet IC holders each having K IC holding parts, after installing one or more ICs on some of the IC holding parts in a certain planet IC holder, when the planet IC holder arranging mechanism makes one rotation, then the planet IC holder makes one revolution around the shaft for the sun. During the one revolution around the shaft for the sun, the planet IC holder makes $\{N\pm(1/K)\}$ rotations on its own shaft for the planet. Therefore, the angle of rotation of the planet IC holder on its own shaft is $\pm 360°/K$ with respect to that before the one revolution around the shaft for the sun. By making K rotations of the planet holder arranging mechanism, the angle of rotation of the planet IC holder on its own shaft for the planet becomes 360° (=0°) with respect to its original angle, so that the IC holding part turns back to its original position at which the IC was installed. The preheated IC can be taken out at this time.

Accordingly, the IC holding part does not turn back to its original position at which the IC was installed even when the planet holder arranging mechanism makes one rotation, but the IC holding part turns back to its original position only when the planet holder arranging mechanism makes K ($\geq 2$) rotations. Therefore, the preheating period can be elongated, and the number of preheated ICs can be increased because the number of ICs which can be carried by each of the planet IC holders is K. As a result, the tack period can be shortened and the space efficiency for the IC constant temperature chamber can be improved.

In the present invention, the IC installing position and the IC removing position with respect to the planet holder arranging mechanism are the same position so as to eliminate an empty space in the IC holding parts. Alternatively, it may also be possible to provide an IC removing position at a position immediately before one intermittent transfer at the IC installing position, or to provide an IC removing position at an inner periphery of the planet holder arranging mechanism and to provide an IC removing position at an outer periphery of the planet holder arranging mechanism. In this case also, the ratio between the revolution around the shaft for the sun and the rotation on its own shaft for the planet satisfies the expression N±(1/K).

According to the second aspect of the present invention, since the planet IC holders have holding means for holding ICs by making them attached to the surfaces of rotation symmetric, the ICs to be preheated are in contact with heat storing members on the surfaces of rotation symmetric by surface contact, so that the heat conduction can be ensured, thereby the preheating time can be shortened.

According to the third and fourth aspects of the present invention, since the holding means has an air adsorbing hole with an IC adsorbing port which is opened to corresponding one of the K surfaces of rotation symmetric, and a spring-energized IC tension leaf for pressing an IC to corresponding one of the surfaces of rotation symmetric, the supplied IC is adsorbed by vacuum to the IC adsorbing port, and then the IC is sandwiched by the spring-energized IC tension leaf, and finally the adsorbing operation is stopped, at the time of the IC installation.

When the IC is to be removed, the IC sandwiched by the spring-energized IC tension leaf is further adsorbed once by vacuum, and then the spring-energized tension leaf is released, and finally the adsorbing operation is stopped to remove the IC. In particular, on the surface of rotary symmetric of each IC holding part, there are only provided with the IC adsorbing port and the spring-energized tension leaf (spring clip) so that the construction is so simple, and the actuator for directly providing the release driving force by pressing the spring-energized IC tension leaf is not provided at the planet IC holder side, but only one is provided at the fixed part side of the IC constant temperature chamber. Therefore, it is not necessary to mount actuators for respective IC holding parts, so that the number of parts can be decreased and the driving toad can be reduced. Also, it becomes possible to make the IC holding parts in the planet IC holder to have many surfaces of two or more.

BRIEF DESCRIPTION OF THE DRAWINGS

The above objects and features as well as other features of the present invention will be more clearly understood from the following description of the preferred embodiments when read in conjunction with the accompanying drawings, wherein.

DESCRIPTION OF THE PREFERRED EMBODIMENTS

Now, embodiments of the present invention will be described with reference to the accompanying drawings. Throughout the specification, the same reference numerals denote the same or similar parts.

Figure 1:
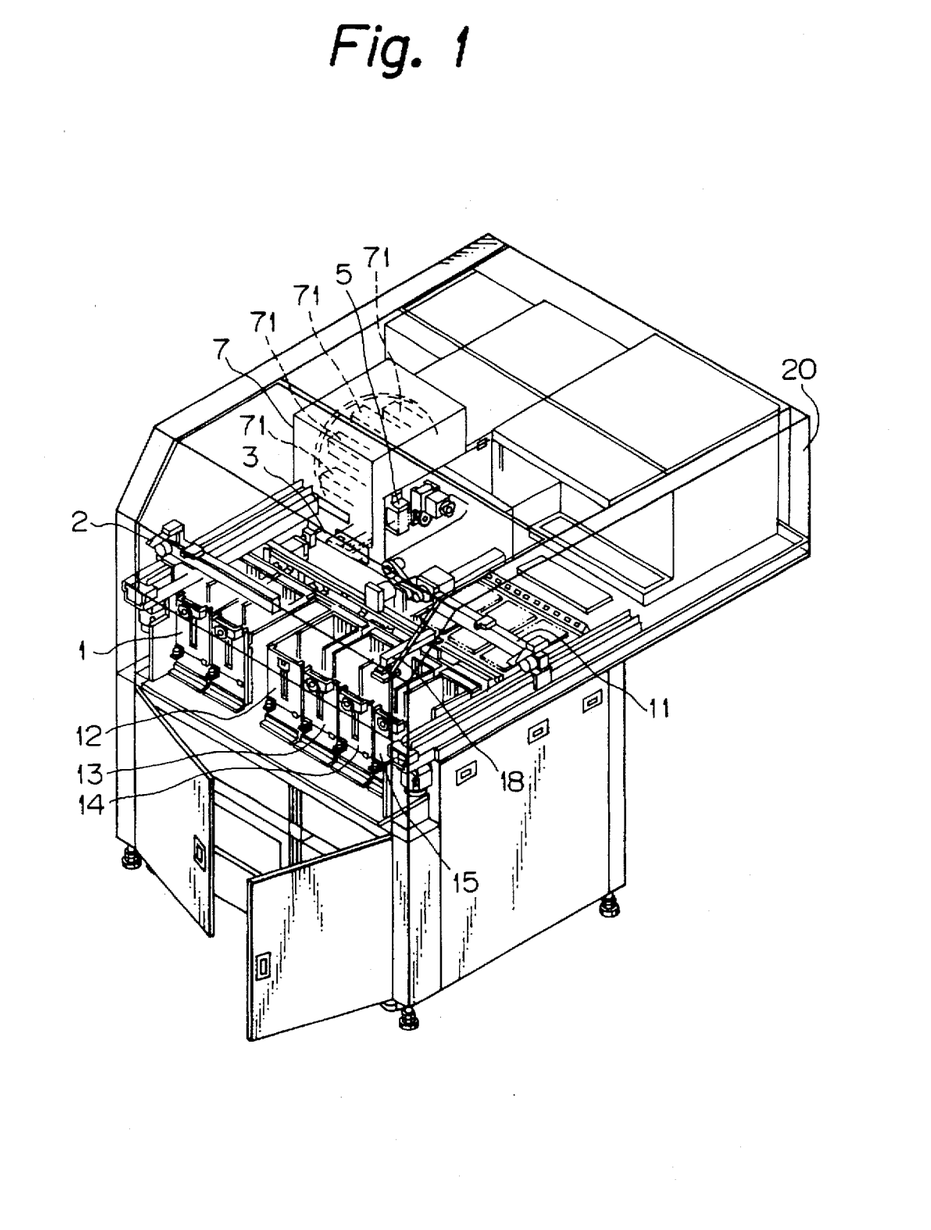
FIG. 1 is a perspective view showing an external view of an IC test handler according to an embodiment of the present invention.

FIG. 1 is a perspective view showing an external appearance of an IC test handler according to an embodiment of the present invention.

Similar to the prior-art IC test handler described with reference to FIG. 6, the IC test handler according to the embodiment of the present invention is also provided with, on a base plate on which a controller and other components are mounted, an input tray elevator 1, an input transfer unit 2, an input shuttle 3, an IC constant temperature chamber 7, a hot-wind blowing unit (not shown), a contactor 5, an output shuttle 6 (not shown in FIG. 1), a cooling shuttle 10 (not shown in FIG. 1), a cooling transfer unit 9 (not shown in FIG. 1), an output transfer unit 11, empty tray elevators 12 and 13, output tray elevators 14 and 15, and a tray transfer unit 18, which are covered by a cover 20.

Figure 2:
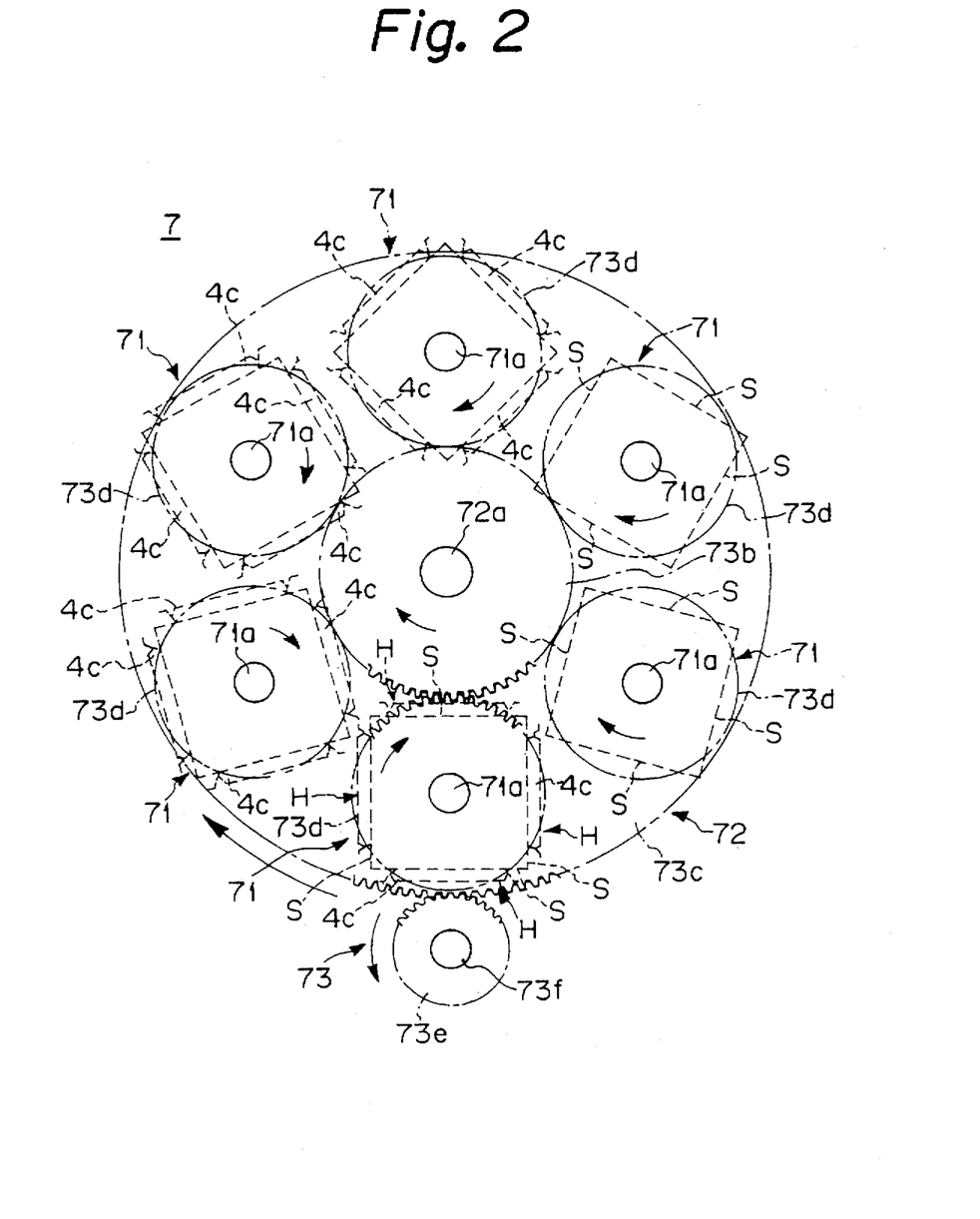
FIG. 2 is a front view showing a general construction of an IC constant temperature chamber in the IC test handler shown in FIG. 1.

FIG. 2 is a front view showing a general construction of an IC constant temperature chamber in the IC test handler shown in FIG. 1. As shown in FIG. 2, the IC constant temperature chamber 7 in this embodiment has, as an example, six planet IC holders 71 each having a shape of a column with a square cross section, and each having four side surfaces each of which functions as an IC holding part. The IC constant temperature chamber also includes a planet holder arranging mechanism 72 with the six planet IC holders 71 arranged in an annular array around a revolving shaft 72a for the sun at equal intervals, i.e., equal distance with an interval of 60°. Each of the six planet IC holders 71 can rotate on its own shaft 71a for the planet. The IC constant temperature chamber 7 further includes a planet gear driving mechanism 73 for intermittently revolving the planet holder arranging mechanism 72 around the revolving shaft 72a in a step of an angle of 60°. During one revolution around the revolving shaft 72a for the sun in the clockwise direction, each of the planet IC holders rotates on its own shaft 71a for the planet by 90° in the clockwise direction.

Figure 3:
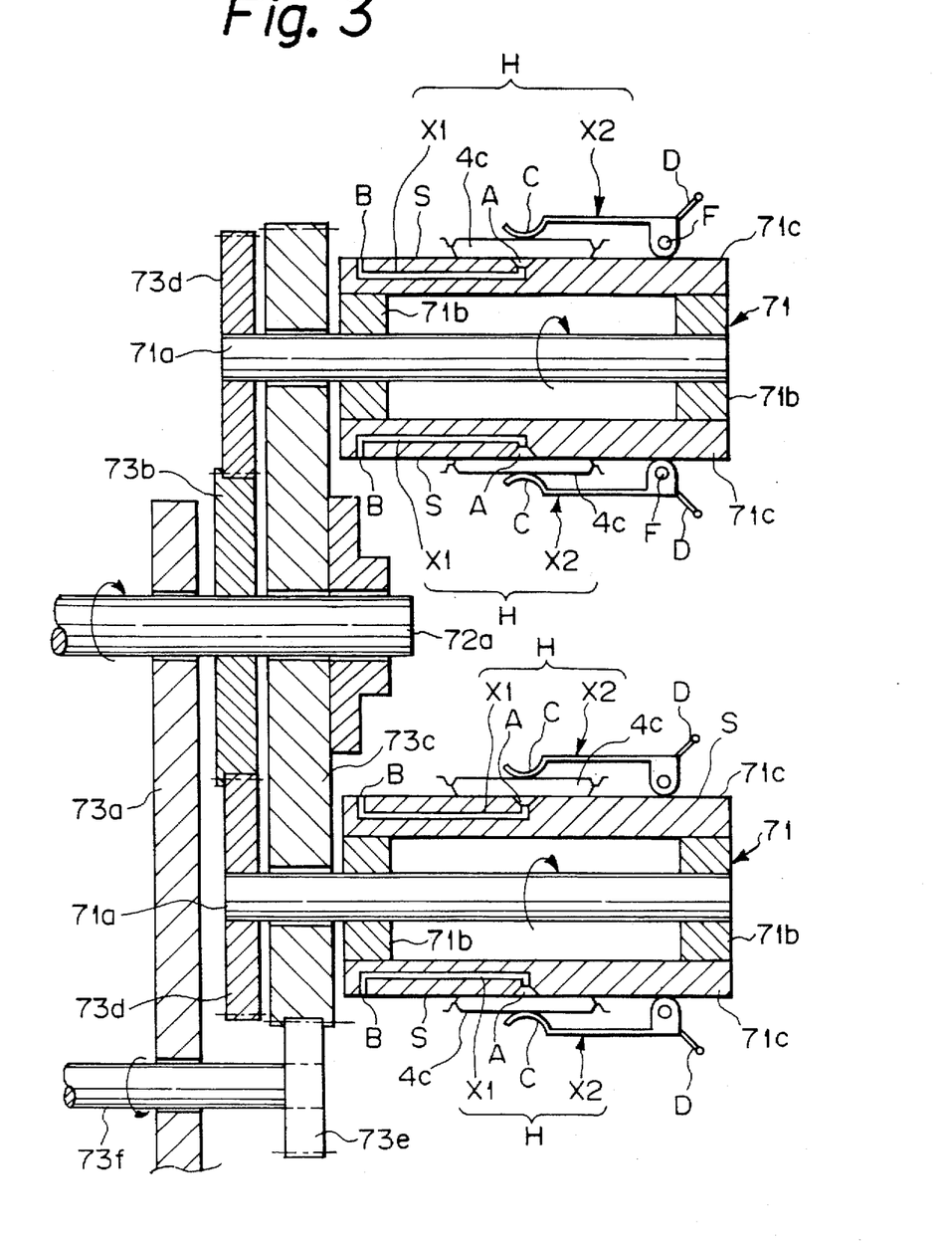
FIG. 3 is a vertical cross-sectional view showing a planet gear driving mechanism of the IC constant temperature chamber.

FIG. 3 is a vertical cross-sectional view showing the planet gear driving mechanism 73 in the IC constant temperature chamber 7. As shown in FIG. 3, the planet gear driving mechanism 73 has differential gear arrays and a supporting plate 73a. The supporting plate 73a stands within the IC constant temperature chamber 7 and is fixed to the IC constant temperature chamber 7. The planet gear driving mechanism 73 also includes a solar gear 73b fixed to the revolving shaft 72a for the sun which is supported by the supporting plate 73a so as to be able to rotate, a toothed rotating plate (a toothed arm plate) 73c supported by the revolving shaft 72a for the sun so as to be able to rotate, six planet gears 73d each being fixed to a rotating shaft 71a for the planet and gearing with the solar gear 73b. Each of the rotating shafts 71a for the planets is supported by the rotating plate 73c so as to be able to rotate. The planet gear driving mechanism 73 further includes a driving shaft 73f having a driving gear 73e which gears with the toothed rotating plate (toothed arm plate) 73c.

Each of the planet IC holders 71 is a planet station having a shape of a column with a square cross section. The planet IC holder 71 consists of bosses 71b and four side plates as heat storing plates (IC receiving parts) 71c. Each of the bosses 71b is fixed to the rotating shaft 71a for the planet. The bosses 71b have square shapes and are opposite to each other. Each of the heat storing plates 71c bridges a space between the bosses 71. Each of the heat storing plates 71c has an IC holding part H. That is, the IC holding part H has a holding means for holding an IC 4c by making it to be attached to the surface S of the heat storing plate 71c. The four surfaces S are rotation symmetric to each other with respect to the rotating shaft 71a. The holding means has an air adsorbing passage X1 with a tapered adsorbing port A and an air exhaust port B, and a spring-energized IC tension leaf X2, i.e., a spring clip, for sandwiching the IC 4c between the leaf X2 and the surface S of rotation symmetric. The tapered adsorption port A is opened at about the center of the surface S of rotation symmetric. The exhaust port B is opened at a place of the surface S of rotation symmetric near the side of the toothed rotating plate 73c.

Figure 4:
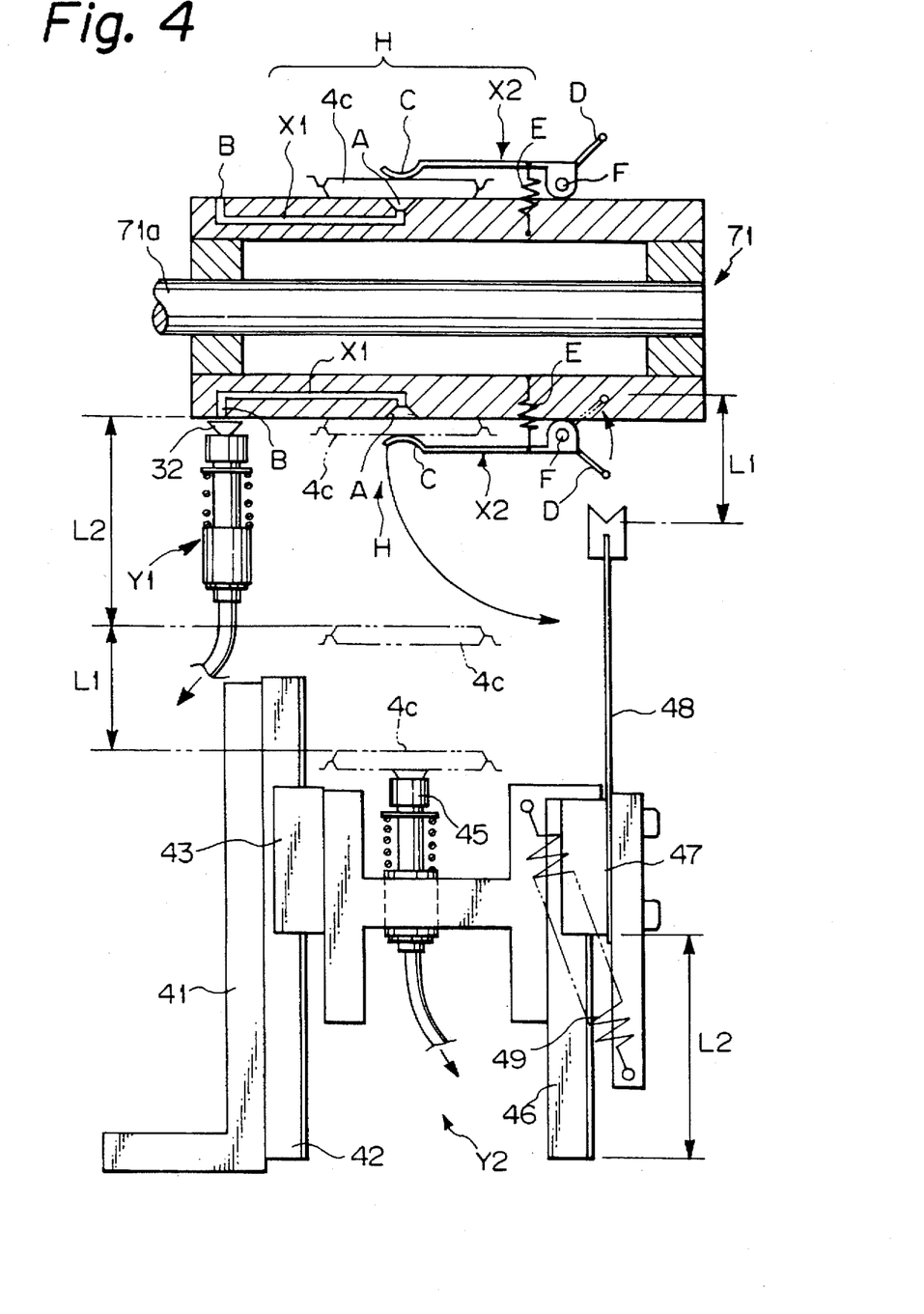
FIG. 4 is a side view explaining an installing or removing operation of an IC in and from a planet IC holder in the planet IC holder array mechanism in the IC constant temperature chamber by a vacuum adsorbing unit and a straightly moving actuator.

FIG. 4 is a partial cross-sectional view of the planet gear driving mechanism 73, for explaining an installing or removing operation of an IC in and from the planet IC holder. As shown in FIG. 3 and FIG. 4, the spring-energized IC tension leaf X2 has an elastic curved tip portion C and an arm portion D. The elastic curved tip portion C and the arm portion D are made into one body. The elastic curved tip portion C is energized to be attached to the surface S of rotation symmetric by pressing it by a torsion spring E (see FIG. 4). In FIG. 4, the torsion spring E is illustrated as if it were a coil spring, however, it should be noted that the illustration is only for the sake of easy illustration, and, in actual, the torsion spring E is wound around a turning shaft F for turning the spring-energized tension leaf X2. The arm portion D receives an operating force from an external world.

On the other hand, at the side of the fixed part of the IC constant temperature chamber, there are provided, as shown in FIG. 4, a vacuum adsorption unit Y1 and a linear actuator Y2. The vacuum adsorbing unit Y1 is placed at an IC removing position directly below the planet holder arranging mechanism 72 so that the vacuum adsorption unit Y1 contacts with the exhaust port B of the adsorbing air passage X1 in the IC holding part H facing the mechanism 72, with the result that the IC is sucked by the vacuum adsorption unit Y1. The linear actuator Y2 presses and moves the spring-energized IC tension leaf X2 so as to directly provide a driving force for releasing the IC from its sandwiched state. The vacuum adsorption unit Y1 operates when the IC 4c is mounted on or removed from the surface S of rotation symmetric to temporarily adsorb and hold it, and has an adsorbing pad 32 closely attached to an exhaust port B of the IC holding part H, the normal line of the surface S of rotation symmetric of the IC holding part H being directing to the directly below direction. The adsorbing pad 32 is coupled to a vacuum source and adsorbs air intermittently, as later described in more detail.

The linear actuator Y2 has a first slide guide rail 42 for guiding a first slider 43 to slide, a vacuum adsorbing unit 45 for elevating an IC, a second slide guide rail 46 for guiding a second slider 47 to slide, an operating rod 48 and a coil spring 49. The first slide guide rail 42 is fixed on an L-shaped angle 41 and extends in the vertical direction. The first slider 43 is driven to move up and down by sliding along the slide guide rail 42. The IC elevating vacuum adsorbing unit 45 is fixed to the first slider 43 by a holder 44. The second slide guide rail 46 is fixed on the holder 44 and extends in the vertical direction. The second slider 47 is driven to move up and down by sliding along the slide guide rail 46. The operating rod 48 is used to press and move an arm part D of the spring-energized IC tension leaf X2 by directly touching the arm part D. The coil spring 49 bridges a portion between the second slide guide rail 46 and the second slider 47, so as to absorb an excessive part of the pressing and moving stroke of the operating rod 48.

Next, the operation of the above-described embodiment will be described.

IC Installing Operation

Figure 5A:
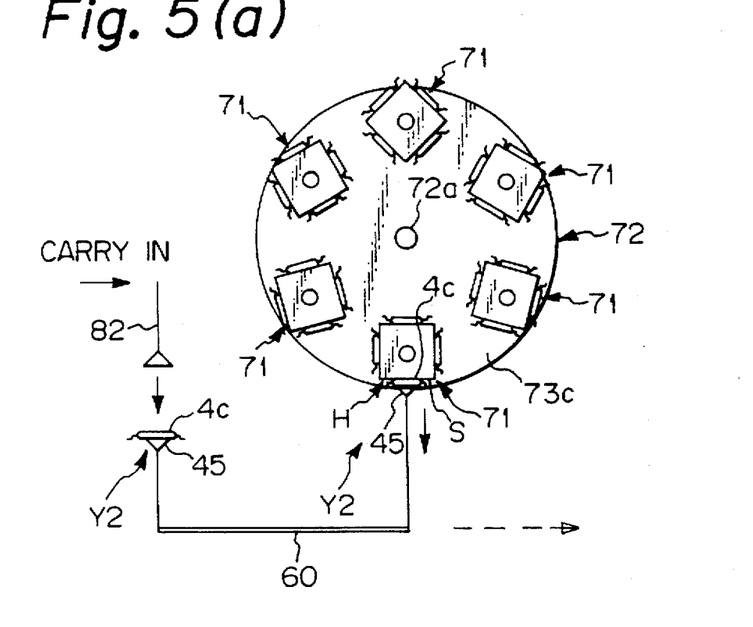
FIG. 5(a) is a front view showing a state in which the IC is removed from the planet IC holder in the planet holder array mechanism in the IC constant temperature chamber.
Figure 5B:
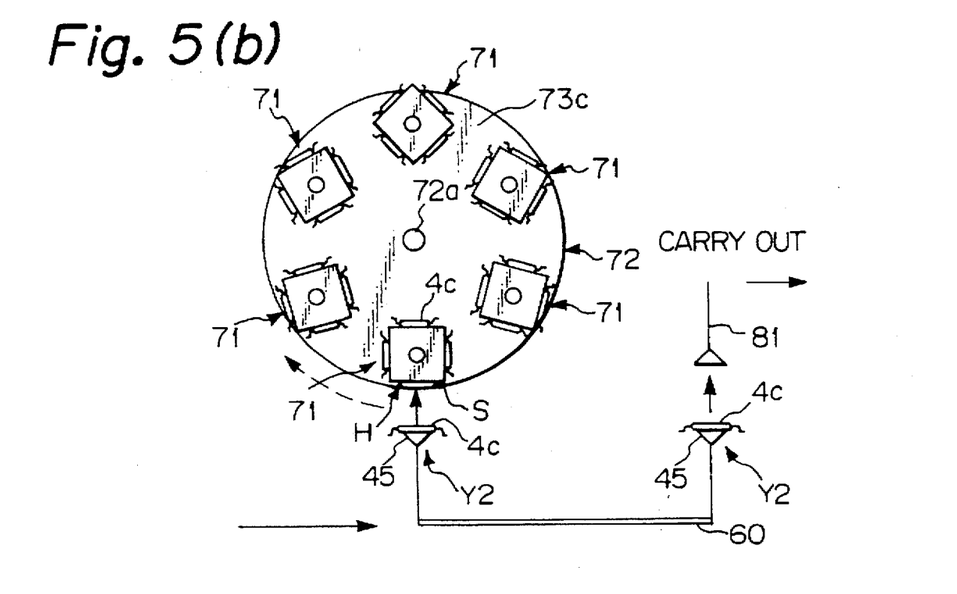
FIG. 5(b) is a front view showing a state in which the IC is installed in the planet IC holder in the planet holder array mechanism in the IC constant temperature chamber.

First, as shown in FIG. 4 and FIG. 5(b), when the rotation of the planet holder arranging mechanism 72 is stopped in a state in which the normal line of the surface S of rotation and symmetric of an empty IC holding part H in one of the planet IC holders 71 directs to the directly below direction at the IC installing and removing position, the linear actuator Y2 at the rear side of a shuttle 60 in the advancing position is placed at the position directly below the surface S of rotation and symmetric, as well as the adsorbing pad 32 is faced to the exhaust port B of the surface S of rotation symmetric. Then, when the vacuum adsorbing unit Y1 intakes air, the adsorbing pad 32 sticks to the exhaust port B so as to adsorb air near the surface S of rotation symmetric through the IC adsorbing port A, the adsorbing air passage X1, and the IC. Almost simultaneous with this, the first slider 43 in the linear actuator Y2 is pressed to be moved upward by a rack and pinion mechanism or the like so that the IC 4c adsorbed by an IC ascending and descending vacuum adsorbing unit 45 is moved upward. Up to the end of the movement of the first slider 43 along a stroke L1, the top end portion of the operating rod 48 directly touches the arm portion D of the spring-energized IC tension leaf X2 to press and move it so that the spring-energized IC tension leaf X2 turns in the counter clockwise direction in the figure against the energizing force by the torsion spring E so as to release the IC from the sandwiched state. After this, during moving along a stroke L2, since the coil spring 49 continues to expand, an excessive pressing and moving of the arm portion D by the operating rod 48 is prevented, however, at the end of this period, the IC 4c on the vacuum adsorbing unit 45 moves to close to the surface S of rotation and symmetric, as well as the adsorbing operation by the vacuum adsorbing unit 45 is stopped. Therefore, the IC 4c on the vacuum adsorbing unit 45 is adsorbed to the IC adsorbing port A so that it is made to be attached to the surface S or rotation and symmetric. After this, when the first slider 43 moves back downward, the top end portion of the operating rod 48 is separated from the arm portion D so that the IC which has been made to be attached to the rotary symmetrical surface S is sandwiched by an elastic curved top end portion C of the spring-energized IC tension leaf X2. Then, after the end of the sandwiching, the air adsorbing operation by the vacuum adsorbing unit Y1 is stopped so that the adsorbing pad 32 is separated from the exhaust port B.

Intermittently Rotating Operation

Next, when the driving shaft 73f is driven to rotate in the counter clockwise direction in FIG. 2, and when the revolving shaft 72a for the sun is driven to rotate in the clockwise direction in FIG. 2, the rotary plate 73c geared with the driving gear 73e is rotated in the clockwise direction in FIG. 2 and the solar gear 73b is also rotated in the clockwise direction in FIG. 2, so that the six planet gears 73d revolve around the revolving shaft 72a for the sun along with the rotation of the rotating plate 73c, while rotating on their own shafts in the clockwise direction in FIG. 2. The ratio of the differential gear arrays is determined in such a way that, during one intermittent operation in this embodiment, each planet gear 73d revolves around the revolving shaft 72a for the sun by 60° in the clockwise direction, and rotates on its own shaft by 15°. That is, in this embodiment, the number of the teeth of each planet gear 73d is set to be 64, and the number of the teeth of the solar gear 73b is set to be 80, so that, during one revolution of the planet gear 73d around the revolving shaft 72a for the sun, the solar gear 73b makes a 1.6 rotation in the clockwise direction and the planet gear 73d rotates on its own shaft by 90°. Accordingly, when the planet gear 73d makes four revolutions around the revolving shaft 72a for the sun, it makes one rotation on its own shaft. Therefore, after 24 intermittent revolving operations, the IC 4c installed in the IC holding part H turns back to its initial position at which the normal line of the surface S of rotation and symmetric is directing toward the directly below direction. During this period, the temperature of the IC 4c in the IC holding part H is sufficiently kept constant by a surface contact.

IC Removing Operation

As described above, when the IC 4c is returned back to its initial position, the straightly moving actuator Y2 of the front side of the shuttle 60 is placed directly below the IC holding part H, as well as the adsorbing pad 32 is faced to the exhaust port B of the surface S of rotation symmetric, as shown in FIG. 4 and FIG. 5(a). Then, when the vacuum adsorbing unit Y1 intakes air, the adsorbing pad 32 is sucked to the exhaust port B to effect vacuum absorption of the IC 4c sandwiched between the surface S and the spring-energized IC tension leaf X2. Almost simultaneous with this, since the first slider 43 of the linear actuator Y2 is pressed to move upward, the top end potion of the operating pestle 48 directly touches the arm portion D of the spring-energized tension leaf X2 to press and move it, so that the spring-energized tension leaf X2 turns in the counter clockwise direction in the figure against the energized force by the torsion spring E so as to release the IC from its sandwiched state. Then, the vacuum adsorbing unit 45 approached to the IC 4c adsorbs this IC 4c, as well as the adsorbing operation by the vacuum adsorbing unit Y1 is stopped. After this, when the first slider 43 again moves downward, the top end portion of the operating pestle 48 is separated from the arm portion D so that the spring-energized IC tension leaf X2 is recovered.

In this connection, during this period, another IC 4c is transferred from a carrying-in vacuum adsorbing unit 82 to the vacuum adsorbing unit 45 in the linear actuator Y2 at the rear side of the shuttle 60.

In the IC constant temperature chamber 7 including the six planet IC holders 71 each having the IC holding part H with four side surfaces as described above, after installing an IC in the IC holding part in one of the planet IC holders 71, even when the planet holder arranging mechanism 72 is rotated one time, the angle of the rotation of each of the planet IC holders 71 on its own shaft for the planet does not become 360°. Only by rotating the planet holder arranging mechanism 72 four times, the planet IC holder 71 first rotates on its own shaft by 360° to recover to its installing position. As a result, according to the present embodiment, the number of the preheating portions can be about four times in comparison with the conventional apparatus in which the IC holding parts are fixedly provided on the peripheral surface of the holder arranging mechanism. Therefore, a sufficient preheating time can be ensured, and the tact period can be shortened.

In the above-described embodiment, the IC holding part H is so constructed that one IC is held on each surface S of rotation and symmetric, however, it is not restricted to this but may be constructed to hold two or more ICs on each surface of rotation symmetric within the scope of the present invention. Also, when the planet IC holder is so constructed to have many faces of more than four, the number of the preheating can be further increased. Further, it is possible to provide six or more planet IC holders 71. For example, twelve planet IC holders may be provided within the scope of the present invention. Still further, it is not always necessary to hold the ICs on all of the surfaces of rotation symmetric, but may alternatively be possible to hold the ICs on some parts of all of the surfaces. Only necessary for the surfaces functioning as IC holding parts is that the surfaces S are rotary symmetric with respect to the rotary shaft 71a. For example, when the planet IC holder 71 is made of a column having a hexagon cross-section, the number of the surfaces of rotation symmetric may be six, three, or two. Still further, the planet IC holder 71 may not have a shape of a column, but may alternatively have a shape of a plate with both side surfaces functioning as the surfaces of rotation symmetric.

In this embodiment also, since the IC to be preheated contacts with the heat storing member of the rotary symmetrical surface side by surface contact, heat conduction is surely effected so that the preheating time can be shortened.

In this embodiment, the spring-energized IC tension leaf X2 has a simple construction with the arm portion D which is activated from an outside, and the operating pestle 48 for directly pressing and moving the arm portion D is provided at the fixed portion side of the IC constant temperature chamber. Therefore, it is not necessary to mount an actuator in each of the IC holding parts H which was necessary in the prior art, so that the number of parts can be decreased and the driving load can be reduced. In other words, the construction of the IC holding parts H themselves can be simplified so that the planet IC holder 71 having a plurality of the IC holding parts H can be realized.

The above-described planet gear driving mechanism 73 consists of the differential gear arrays of a two motor drive. To modify this to be of one motor drive, one of the driving shaft 73f and the revolving shaft 72a for the sun may be fixed, and only the others may be provided with a rotating force. In this case, the planet IC holder makes one or more rotation on its own shaft during one revolution around the revolving shaft, however, if the angle of the rotation before and after the rotation on its own shaft are the same, the rotating speed does not cause a so serious problem. It is, however, desirable to make the rotating speed to be lower in order to reduce the driving load. To construct the differential gear arrays by one motor drive, it may also be possible to associate the driving shaft 73f and the revolving shaft 72a for the sun by a timing belt or the like.

As described above, the IC test handler according to the present invention is characterized by the IC constant temperature chamber comprising a plurality of planet IC holders each having many surfaces as IC holding parts, and has the following effects.

(1) By rotating the planet holder arranging mechanism by K times, a IC holding part returns to the same position as that when the IC was installed, so that the staying time for preheating can be elongated, and the number of stayed ICs for preheating can be increased. The tact period can be shortened and the efficiency of the space for the IC constant temperature chamber can be improved.

(2) Since the planet IC holder has holding means for holding an IC by making it to be attached to a surface of rotation and symmetric, the IC to be preheated is in contact with a heat storing member at the side of the surface of rotation and symmetric by surface contact, so that heat conduction is surely effected to shorten the preheating time.

(3) In particular, the construction is so simple in which the surface rotation and symmetric of each IC holding part is provided with an IC adsorbing port and a spring-energized IC tension leaf. In addition, since the actuator for providing a driving force for releasing the IC from its sandwiched state by pressing and moving the spring-energized IC tension leaf is not provided at the side of the planet holder arranging mechanism but is provided at the side of the fixing portion of the IC constant temperature chamber, it is not necessary to mount the actuator for each of the IC holding parts. Therefore, the number of parts can be reduced and the driving load can be decreased. Further, it becomes possible to make the IC holding part in the planet IC holder to have many surfaces of more than four surfaces.

What is claimed is:

1. An IC test handler equipped with an IC constant temperature chamber for cooling or heating ICs to perform temperature tests of the ICs, said IC constant temperature chamber comprises:

a plurality of planet IC holders, the number of said planet IC holders being M, each of said plurality of planet IC holders being able to rotate on its own shaft for the planet, and having a plurality of surfaces of rotation symmetric with respect to said shaft for the planet, the number of said surfaces being K, said surfaces functioning as IC holding parts;

a planet holder arranging mechanism that can rotate around a shaft for a sun, for arranging said plurality of planet IC holders in an annular array with equal intervals around said shaft for the sun, said plurality of planet IC holders being able to revolve around said shaft for the sun; and an intermittent rotation driving mechanism for intermittently rotating said planet holder arranging mechanism in step of 360°/M, where said intermittent rotation comprising alternate periods of stop period and rotation period, so that, when said plurality of planet IC holders makes one rotation around said shaft for the sun, the number of rotations of each of said planet IC holders on its own shaft is $\{N\pm(1/K)\}$, where N is an arbitral integer, at least one IC which was attached to one of said surfaces during one of the stop periods in said intermittent rotation being removed from said surface during another one of the stop periods in said intermittent rotation after said planet holder arranging mechanism has been rotated around the sun for a time sufficient for said IC to be preheated for the temperature test.

2. An IC test handler as claimed in claim 1, wherein each of said plurality of planet IC holders comprises holding means for holding said ICs by making the ICs to be attached to said surfaces of rotation symmetric.

3. An IC test handler as claimed in claim 2, wherein each of said holding means comprises an air adsorbing passage having an IC adsorbing port opened to corresponding one of said plurality of surfaces of rotation symmetric, and a spring-energized IC tension leaf for pressing a corresponding one of said ICs against said corresponding one of said plurality of surfaces or rotation symmetric.

4. An IC test handler as claimed in claim 3, wherein at an IC installing or removing position directly below said planet holder arranging mechanism (72), there are provided a vacuum adsorbing unit (Y1) for adsorbing said ICs by contacting with an exhaust port (B) of said air adsorbing passage (X1) in said holding means of the planet IC holder faced to said IC installing or removing position, and an actuator for pressing and moving said spring-energized IC tension leaf to directly release the IC from its sandwiched state.

\* \* \* \* \*